(12) United States Patent
Linder et al.

(10) Patent No.: US 7,098,834 B2
(45) Date of Patent: Aug. 29, 2006

(54) MULTI-MODE ANALOG TO DIGITAL CONVERTER

(75) Inventors: Lloyd F. Linder, Agoura Hills, CA (US); Michael F. Clingempeel, Herndon, VA (US); William W. Cheng, Redondo Beach, CA (US); William J. Rinard, Annapolis, MD (US); Benjamin Felder, Saugus, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 10/969,283

(22) Filed: Oct. 20, 2004

(65) Prior Publication Data

US 2006/0082484 A1    Apr. 20, 2006

(51) Int. Cl.
*H03M 1/12*    (2006.01)
*H03M 3/00*    (2006.01)
*H03M 1/44*    (2006.01)

(52) U.S. Cl. .................. 341/155; 341/162; 341/143
(58) Field of Classification Search ............ 341/143, 341/161–163
See application file for complete search history.

(56) References Cited

U.S. PATENT DOCUMENTS

| 5,510,789 | A  | * | 4/1996 | Lee ............................. 341/120 |
| 6,340,944 | B1 | * | 1/2002 | Chang et al. ................ 341/161 |
| 6,762,707 | B1 | * | 7/2004 | Wolf et al. .................. 341/155 |
| 2002/0105451 | A1 | * | 8/2002 | Gulati et al. ................ 341/144 |

* cited by examiner

*Primary Examiner*—Howard L. Williams
(74) *Attorney, Agent, or Firm*—Morrison & Foerster LLP

(57) ABSTRACT

A multi-mode analog to, digital converter (ADC). The novel ADC includes an input terminal for receiving an analog input signal; a plurality of processing stages, each processing stage adapted to generate an output signal from an input to that processing stage; and a mechanism for determining a mode of operation and in accordance therewith connect the processing stages and the input terminal in a predetermined configuration. In an illustrative embodiment, the ADC can be configured as a subranging ADC, and the mechanism for determining, the mode of operation includes a signal processor for automatically selecting the mode of operation based on the frequency components of the input signal.

86 Claims, 3 Drawing Sheets

MULTI-MODE ANALOG TO DIGITAL CONVERTER

BACKGROUND OF THE INVENTION

1. Field of the Invention

The present invention relates to electronical and electronic components, circuits and systems. More specifically, the present invention relates to analog to digital converters.

2. Description of the Related Art

The function of an analog to digital converter (ADC) is to accurately convert an analog input signal into a digital output represented by a coded array of binary bits. The output bits are generated by processing the analog input signal through a number of comparator steps. There are several types of ADC architectures, each architecture having different characteristics, such as bandwidth, speed, power, and resolution. A flash ADC, for example, produces an N-bit digital output in one step with $2^N-1$ parallel comparators. Flash ADCs provide higher speed of conversion, but are limited by higher input capacitance, power consumption, and device yield constraints associated with the high number of comparators in the circuitry. At the other extreme, a successive approximation ADC produces an N-bit digital output in N sequential steps using a single comparator. Successive approximation ADCs are simple in structure, and may be very accurate, but they have very slow conversion times due to the serial nature of the conversion process.

Subranging ADCs provide an intermediate compromise between flash ADCs and successive approximation ADCs. Subranging ADCs typically use a low resolution flash quantizer during a first or coarse pass to convert the analog input signal into the most significant bits (MSB) of its digital value. A digital to analog converter (DAC) then generates an analog version of the MSB word, which is subtracted from the input signal at a summing node to produce a residue or residual signal. The residue signal is sent through one or more fine passes (through the same quantizer or additional low resolution quantizers) to produce the lower significant bits of the input signal. The lower significant bits and the MSB word are then combined by digital error correcting circuitry to produce the desired digital output word.

Certain applications, particularly in the military communications market, require ADCs that can operate over a wide range of bandwidth, dynamic range, and power consumption. A number of new military systems want to combine several services, such as GPS data links, electronic warfare, and narrowband as well as wideband communications, into a single device. Each of these services uses a different type of waveform. Currently available ADCs, however, are not capable of adapting to different types of signals. Conventional ADCs work optimally only at a narrow range of bandwidth, resolution, and power. For instance, one ADC may operate at low resolution and wide bandwidth, while another ADC operates at high resolution and narrow bandwidth. Currently, in order for a system handle multiple services, it would require multiple ADCs to be switched in, resulting in a system that is large, heavy, expensive, and high power.

Hence, there is a need in the art for a single ADC that can operate over a wide range of bandwidth, resolution, and power consumption.

SUMMARY OF THE INVENTION

The need in the art is addressed by the multi-mode analog to digital converter of the present invention. The novel ADC includes an input terminal for receiving an analog input signal; a plurality of processing stages, each processing stage adapted to generate an output signal from an input to that processing stage; and a mechanism for determining a mode of operation and in accordance therewith connect the processing stages and the input terminal in a predetermined configuration. In an illustrative embodiment; the ADC can be configured as a subranging ADC, and the mechanism for determining the mode of operation includes a signal processor for automatically selecting the mode of operation based on the frequency components of the input signal.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
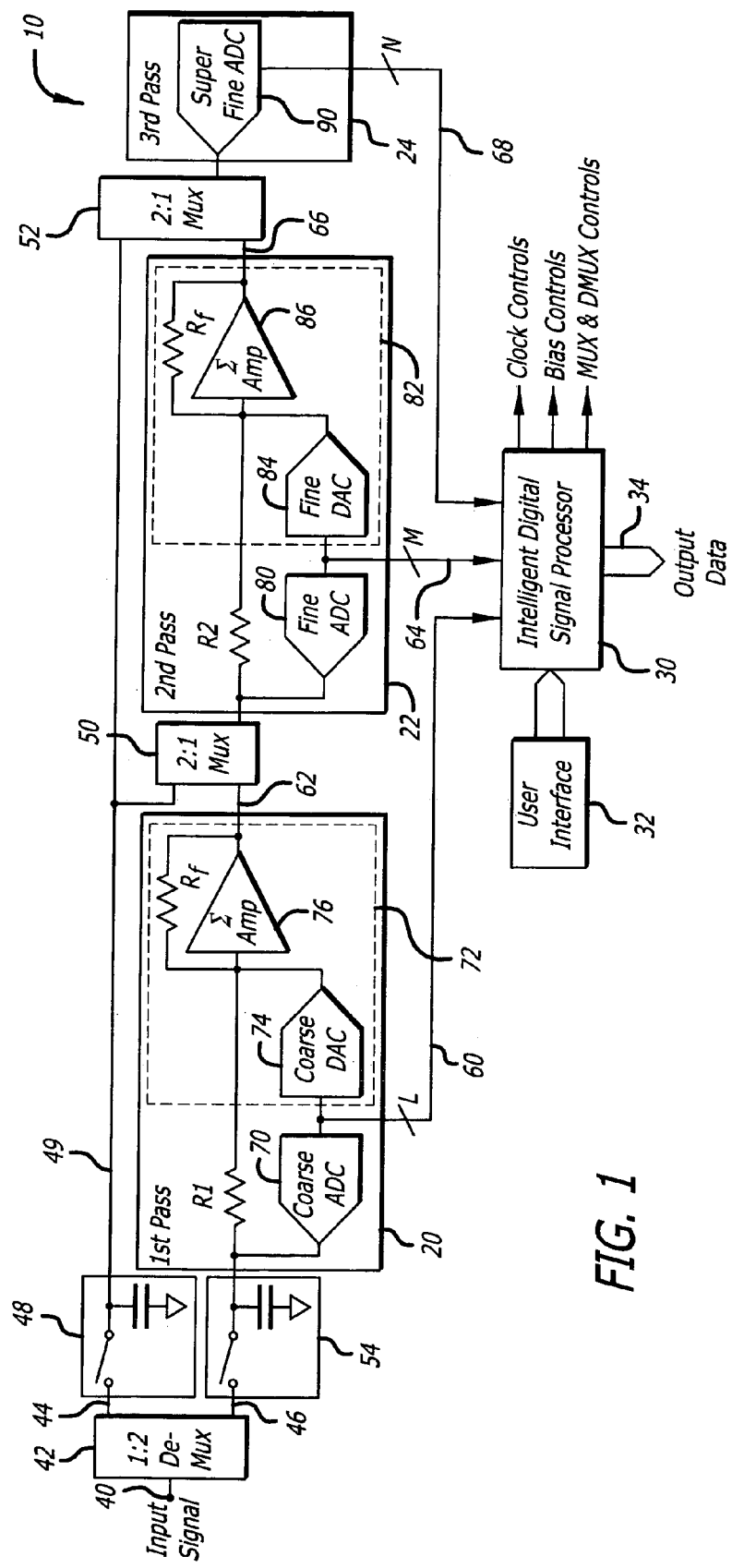
FIG. 1 is a simplified block diagram of an illustrative reconfigurable ADC designed in accordance with the teachings of the present invention.

FIG. 1 is a simplified block diagram of an illustrative embodiment of a reconfigurable ADC 10 designed in accordance with the teachings of the present invention. The reconfigurable ADC 10 includes an input terminal 40, a plurality of processing stages (20, 22, 24), and a mechanism for determining a mode of operation and in accordance therewith connecting the processing stages (20, 22, 24) and the input terminal 40 in a predetermined configuration. Thus, the ADC 10 is adapted to operate in different modes by modifying its basic architecture. Each mode is optimized for a particular dynamic range, bandwidth, and DC power consumption. The mode is determined based on the input waveform, service requirements, or the signal environment.

In the illustrative embodiment, the ADC is a subranging ADC 10 having three processing stages or passes: a first "coarse" pass 20, a second "fine" pass 22, and a third "super fine" pass 24; and can be configured to operate as a single pass, two-pass, or three-pass ADC depending on the desired mode of operation. The ADC 10 is configured by a digital signal processor (DSP) 30, which controls the inputs to the processing stages and combines their outputs in accordance with the mode of operation. The mode of operation may be automatically determined by the DSP 30, or it may be manually selected by a user. The DSP 30 can also be adapted to control the sampling rate and power of the ADC 10, and to power down any circuits that are not in use during a particular mode.

In the illustrative embodiment of FIG. 1, an analog input signal is input to the ADC 10 at an input terminal 40 to a 1:2 demultiplexer (DMUX) 42. The DMUX 42, which is controlled by the DSP 30 (control signals are not shown in the figure for clarity), outputs the signal to either a first path 44 or a second path 46. In the first path 44, the signal is sampled by a first sample and hold (S/H) circuit 48, which outputs a first sampled version of the signal 49 to a first 2:1 multiplexer (MUX) 50 and a second 2:1 MUX 52. In the second path 46, the input signal is sampled by a second S/H circuit 54, which outputs a second sampled version of the input signal to the first processing stage 20.

The first processing stage 20 outputs a first (L-bit) digital word signal 60 and a first residue signal 62. The first residue signal 62 is the second input to the first MUX 50. The first MUX 50, which is controlled by the DSP 30, chooses either the first residue signal 62 or the first sampled signal 49, and outputs it to the second processing stage 22. The second processing stage 22 outputs a second (M-bit) digital word signal 64 and a second residue signal 66. The second residue signal 66 is the second input to the second MUX 52. The second MUX 52, which is controlled by the DSP 30, chooses either the second residue signal 66 or the first sampled signal 49, and outputs it to the third processing stage 24. The third processing stage 24 outputs a third (N-bit) digital word signal 68.

The digital words 60, 64, and 68 from each of the three passes 20, 22, and 24 are processed by the DSP 30 to generate a digital output 34 representing the analog input signal. The DSP 30 also generates controls signals for the MUXes 50 and 52, and the DMUX 42. The DSP 30 may also generate control signals for adjusting the clock rate (the clock, which generates a clock signal to each of the ADC components, is not shown in FIG. 1 for clarity) and the biases for the ADC components, in order to control the sampling rate of the ADC 10 and the power dissipated by the ADC 10 based on the mode of operation. The DSP 30, may be adapted to receive external inputs from a user interface 32 for selecting the mode of operation of the ADC 10, and/or it may be adapted to automatically determine the mode of operation based on characteristics of the input signal.

As shown in FIG. 1, the first processing stage 20 includes a coarse ADC or quantizer 70, which digitizes the input to the first processing stage 20 and outputs an L-bit digital word 60; and a reconstruction or summing node circuit 72, which subtracts an analog version of the digital word 60 from the input to the first processing stage 20 (which is converted from a voltage signal to a current by a resistor R1) to produce a first residue signal 62. The summing node circuit 72 includes a coarse digital to analog converter (DAC) 74 for converting the digital word 60 to analog, and a summing amplifier 76 for generating the first residue signal 62.

Similarly, the second processing stage 22 includes a fine ADC or quantizer 80, which digitizes the input to the second processing stage 22 and outputs an M-bit digital word 64; and a summing node circuit 82, which subtracts an analog version of the digital word 64 from the input to the second processing stage 22 (which is converted from a voltage signal to a current by a resistor R2) to produce a second residue signal 66. The summing node circuit 82 includes a fine DAC 84 for converting the digital word 64 to analog, and a summing amplifier 86 for generating the second residue signal 66.

The last (third) processing stage 24 includes a super fine ADC or quantizer 90, which digitizes the input to the third processing stage 24 and outputs an N-bit digital word 68.

The illustrative ADC 10 operates in five basic modes of operation, though there can be potentially more modes. The first mode is a wideband, low resolution, high speed mode, where the super fine ADC 90 is used as a single-pass flash ADC. The DMUX 42 selects the first path 44, sending the input signal to the first S/H 48. In the preferred embodiment, the first S/H 48 is a wideband S/H. The sampled signal 49 is then sent by the second MUX 52 to the super-fine ADC 90, which generates an N-bit digital representation 68 of the input signal. All other components of the ADC 10 that are not being used (the first and second passes 20 and 22, the second S/H 54, and the first MUX 50) are powered down by the DSP 30. This mode can be used for wide bandwidth applications (such as electronic warfare, synthetic aperture radar, or secure communications), or for determining which mode of operation the ADC 10 should be in.

The second mode of operation is a low resolution, narrow bandwidth mode where the coarse ADC 70, with the lowest number of bits L, is used as a single-pass flash ADC. The DMUX 42 selects the second path 46, sending the input signal to the second S/H 54. In the preferred embodiment, the second S/H 54 has a lower speed, and therefore higher resolution, than the first S/H 48. The sampled signal is then sent to the coarse ADC 70, which generates an L-bit digital representation 60 of the input signal. All other components of the ADC 10 that are not being used (the summing node circuit 72 of the first pass 20, the second and third passes 22 and 24, the first S/H 48, and the two MUXes 50 and 52) are powered down by the DSP 30.

The third mode of operation is a medium resolution mode, where the ADC 10 is configured as a two-pass ADC, using either the first and second processing stages 20 and 22, or the second and third processing stages 22 and 24. In the first configuration, the DMUX 42 selects the first path 44, sending the input signal to the first S/H 48. The sampled signal 49 is then sent by the first MUX 50 to the second pass circuit 22, which generates an M-bit digital word 64 and a residue signal 66. The second MUX 52 sends the residue signal 66 to the third pass circuit 24, which generates an N-bit digital representation 68 of the residue signal 66. The DSP 30 then combines the M-bit word 64 and the N-bit word 68 to form a medium resolution digital output 34 representing the input signal. All other components of the ADC 10 that are not being used (the first pass 20 and the second S/H 54) are powered down by the DSP 30.

Alternatively, the third mode can be configured using the first and second processing stages 20 and 22. In this configuration, the DMUX 42 selects the second path 46, sending the input signal to the second S/H 54. The sampled signal is processed by the first pass circuit 20, which generates an L-bit digital word 60 and a residue signal 62. The first MUX 50 sends the residue signal 62 to the second pass circuit 22, which generates an M-bit digital representation 64 of the residue signal 62. The DSP 30 then combines the L-bit word 60 and the M-bit word 64 to form a medium resolution digital output 34 representing the input signal. All other components of the ADC 10 that are not being used (the third pass 24, the first S/H 48, the second MUX 52, and the summing node circuit 82 of the second pass 22) are powered down by the DSP 30. If this configuration is used for the two-pass third mode, instead of using the second and third pass circuits 22 and 24, then the first MUX 50 is not necessary to the ADC 10. The residue output 62 of the first pass circuit 20 can be connected directly to the input of the second pass circuit 22. The addition of the MUX 50, however, makes the ADC 10 more flexible, allowing the option to skip the first pass circuit 20 and send the input signal directly to the second pass circuit 22.

The fourth mode of operation is a high resolution mode, where the ADC 10 is configured as a three-pass ADC, and the coarse 20, fine 22, and super fine 24 passes are all used. The DMUX 42 selects the second path 46, sending the input signal to the second S/H 54. The sampled signal is processed by the first pass circuit 20, which generates an L-bit digital word 60 and a first residue signal 62. The first MUX 50 sends the first residue signal 62 to the second pass circuit 22, which generates an M-bit digital representation 64 of the first residue signal 62, and a second residue signal 66. The second MUX 52 sends the second residue signal 66 to the third pass circuit 24, which generates an N-bit digital representation 68 of the second residue signal 66. The DSP 30 then combines the L-bit word 60, the M-bit word 64 and the N-bit word 68 to form a high resolution digital output 34 representing the input signal. Any components of the ADC 10 that are not being used (the first S/H 48) are powered down by the DSP 30.

The fifth mode of operation is a highest resolution, narrow bandwidth mode, where the ADC 10 is configured as in the fourth mode, and the DSP 30 performs additional processing in order to further extend the dynamic range of the signal by using over-sampling techniques, such as those described in U.S. Pat. No. 6,580,383, entitled "HIGH RESOLUTION ADC BASED ON AN OVERSAMPLED SUBRANGING ADC," the teachings of which are incorporated herein by reference.

In order to determine which mode of operation the ADC 10 should use, the DSP 30 may be adapted to automatically determine the mode based on the bandwidth and modulation of the input signal. To this end, the ADC 10 is first configured in the first (wideband) mode. This can be accomplished either on power-up or through an external command. The superfine ADC 90 digitizes the incoming signal, and the DSP 30 determines the characteristics of the incoming signal, including what type of signal modulation and what signal bandwidth is being received. This can be accomplished through analysis of FFTs (Fast Fourier Transforms) of the incoming signal. Based on this information, the DSP 30 determines the ADC mode and sends out appropriate control signals to adjust the ADC clock rate, the ADC power, the SLEEP command (which determines what circuits are on and what circuits are off), the configuration of the error correction, and the MUX and DMUX controls that configure the ADC 10. A second way to have reconfigurability is to have stored look-up tables for the different modes, and the mode can be externally programmed based on the application, as opposed to the concept of changing modes "on the fly."

Figure 2:
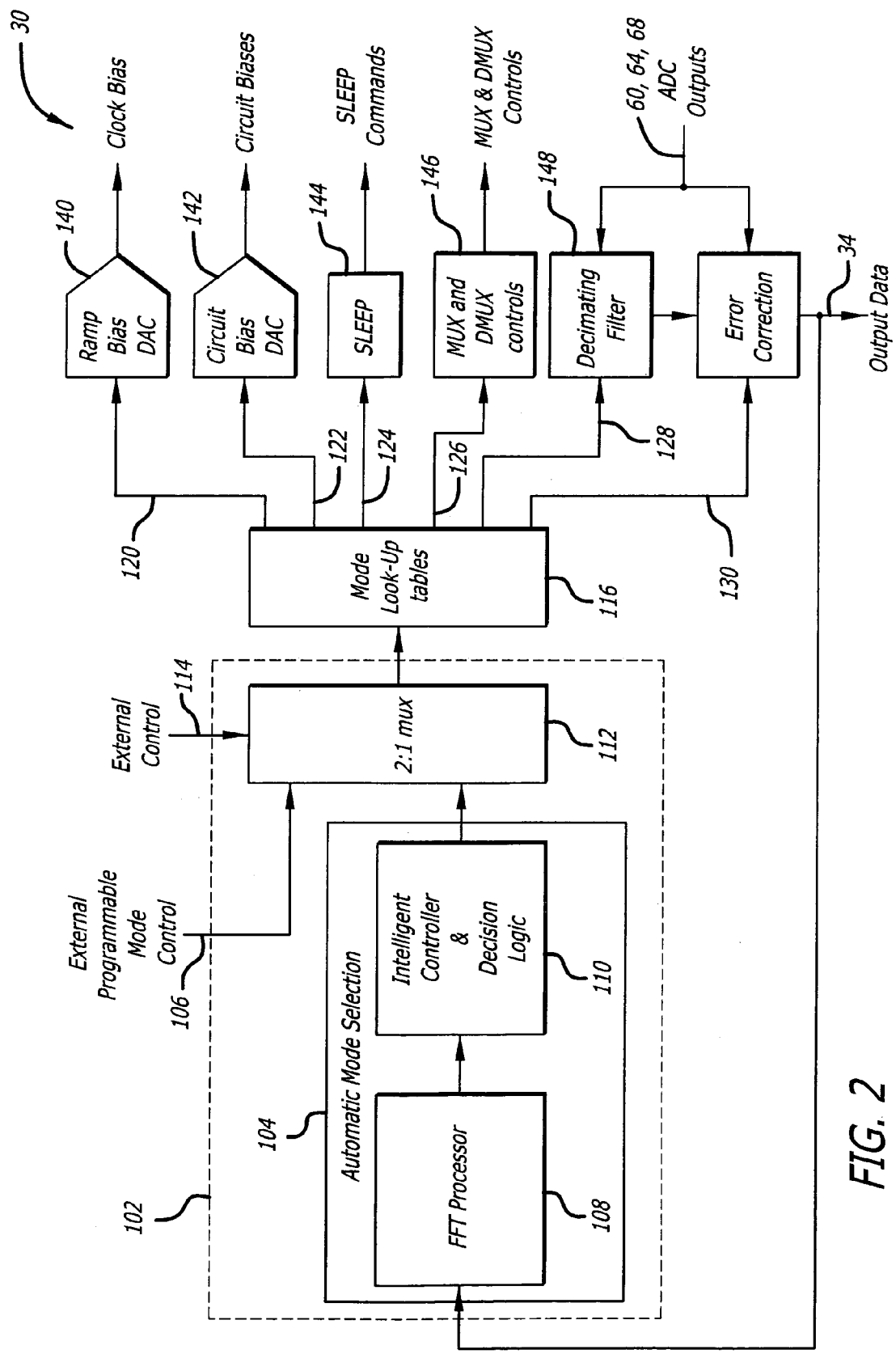
FIG. 2 is a simplified block diagram of an illustrative DSP for the reconfigurable ADC designed in accordance with the teachings of the present invention.

FIG. 2 is a simplified block diagram of an illustrative DSP 30 for the ADC 10 designed in accordance with the teachings of the present invention. The DSP 30 includes a number of different functions. First, it includes an error correction module 100 that receives the digital words 60, 64, and 68 generated by the first 20, second 22 and third 24 processing stages, respectively, and combines them to form a digital output 34 representing the original input signal in accordance with error correction techniques for subranging ADCs, which are well known in the art. Which digital words 60, 64, or 68 are used to form the final output 34 depends on the mode of operation. One, two, or all three words may be used, depending on whether the ADC 10 is configured as a one, two, or three pass ADC.

The DSP 30 also includes a module 102 for determining which mode of operation the ADC 10 should use. This can be done automatically by an automatic mode selection unit 104, or manually through an external programmable mode control signal 106 from the user interface 32. The automatic mode selection unit 104 includes an FFT (Fast Fourier Transform) processor 108, which processes the digital representation 34 of the input signal and provides information on the input signal, such as bandwidth, that allows the ADC 10 to be dynamically configurable for power, mode, and clock rate. A decision logic module 110 takes the information provided by the FFT processor 108 and determines which mode the ADC 10 should use to optimally process the received bandwidth. In an illustrative embodiment, automatic mode selection is performed while the ADC 10 is configured in the first (wideband) mode. As discussed above, this can be accomplished either on power-up or through an external command. The mode selected by the decision logic module 110 is input to a 2:1 MUX 112, along with the external programmable mode control signal 106. The MUX 112 chooses either the automatically determined mode or the externally selected mode, depending on an external control signal 114.

While the FFT is used in the illustrative embodiment for determining the mode of operation, other methods for determining the frequency components of the input signal, such as DCT (Discrete Cosine Transform) or other types of Fourier transforms, may be used without departing from the scope of the present teachings.

Based on the mode, the DSP then generates a number of control signals for the ADC 10, including sampling rate controls 120, circuit bias controls 122, SLEEP controls 124 for powering down portions of the ADC 10, MUX and DMUX controls 126, controls 128 for a decimating filter 148, and controls 130 for the error correction unit 100. A look-up table 116 stores which controls should be sent for each mode.

The look-up table 116 sends a set of controls 120 that drive a sampling rate controller 140, which controls the sampling rate of the ADC 10 by adjusting the ramp rate of the clock generator. One way to accomplish this is by using programmable DACs to generate bias currents for the clock generator. A second set of controls 122 drive a circuit bias generator 142, which generates bias currents for each of the ADC components (such as the S/H circuits 48 and 54; the coarse 70, fine 80, and super fine 90 ADCs; the coarse 74 and fine 84 DACs; and first 76 and second 86 summing amplifiers). Thus, the power dissipated in the ADC 10 can be controlled depending on the mode of operation. Again, this can be accomplished using DACs to set the bias currents. The circuit biases can also control ADC parameters such as amplifier feedback gain, S/H capacitor value, and quantizer Q levels. This allows the reduction or increase in signal amplitude for a given mode, reducing or increasing the noise bandwidth for a given mode, thereby affecting signal acquisition, SFDR (spur free dynamic range), and SNR (signal to noise ratio).

Another set of controls 126 drive a MUX and DMUX controller 146, which generates control signals for the DMUX 42 and MUXes 50 and 52, in order to configure the ADC 10 for the selected mode. The look-up table 116 also sends control signals 130 to the error correction logic 100 for the desired mode of operation. An N:1 decimating filter 148 can also be included in the DSP 30 for processing the ADC digital word outputs 60, 64, and 68 in the fifth narrow bandwidth, highest resolution mode. This is controlled by commands 128 from the look-up table 116.

When any of the ADC components are not used for a particular mode, they can be powered down using a SLEEP command (this includes the high resolution N:1 decimating filter 148). The SLEEP commands are included in the mode look-up table 116 and generated by a SLEEP module 144.

Thus, the ADC 10 is programmable to continuously vary performance to optimize instantaneous bandwidth, power dissipation, sampling rate, and dynamic range. Based on the mode of operation, the DSP 30 configures the ADC 10 using a number of MUXes and/or DMUXes controlling the inputs to several processing stages and powers down any circuitry not needed for that mode. This provides a DC power savings that is linked directly to the mode of operation. The DSP 30 also drives programmable DACs for controlling circuit biases, and therefore the power, in the ADC 10, as well as the sampling rate. The dynamic range is influenced by the configuration and power of the ADC 10, and the oversampling ratio when using oversampling techniques.

Figure 3:
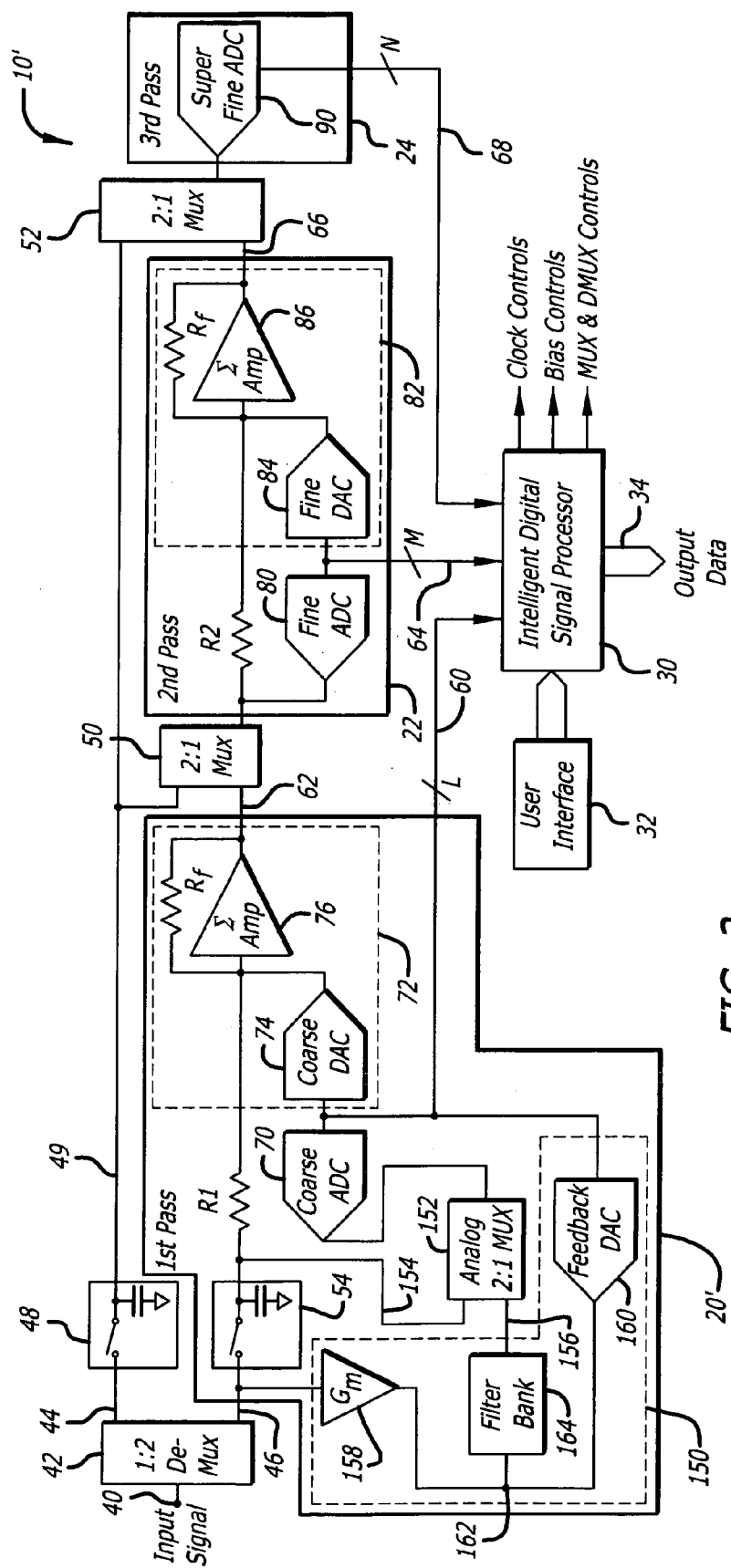
FIG. 3 is a simplified block diagram of an alternative illustrative embodiment of a reconfigurable ADC designed in accordance with the teachings of the present invention.

In the illustrative embodiment described above, the programmable ADC 10 is configured as a subranging ADC. The invention, however, is not limited thereto. The concept can be applied to other ADC architectures, such as the flash ADC, folding/interpolating ADC, or successive approximation ADC, without departing from the scope of the present teachings. FIG. 3 shows an example where the programmable ADC, or one processing stage of the ADC, can be configured as a sigma delta converter.

FIG. 3 is a simplified block diagram of an alternative illustrative embodiment of a reconfigurable ADC 10' designed in accordance with the teachings of the present invention. The ADC 10' of this embodiment is similar to the ADC 10 of FIG. 1, except it has additional circuitry in the first pass circuit 20', which allows it to be configured as a sigma-delta ADC, in addition to the modes of operation described above.

The first pass circuit 20' includes a sigma-delta stage 150 and an analog 2:1 MUX 152 in addition to the components of the first pass circuit 20 of FIG. 1. The MUX 152 is added between the S/H 54 and the coarse ADC 70, and is adapted to select a first input 154 coupled to the output of the S/H 54 or a second input 156 coupled to the output of the sigma-delta stage 150, and apply it to the coarse ADC 70. The sigma-delta stage 150 includes a transconductance amplifier 158, which amplifies the signal from the second output 46 of the DMUX 42, and a feedback DAC 160, which digitizes the output from the coarse ADC 70 (the output of the coarse ADC 70 is applied to the feedback DAC 160 in addition to the coarse DAC 74 and the signal processor 30). The output of the feedback DAC 160 is subtracted from the output of the transconductance amplifier 158 at a summing node 162, and the resulting signal is applied to a selectable filter bank 164. The output of the filter bank 164 is coupled to the second input 156 of the MUX 152.

With the analog MUX 152 set to the first input 154, the first stage 20' is configured as the first pass of a multi-pass ADC, and the ADC 10' operates as described above for the embodiment of FIG. 1. When the 2:1 MUX 152 selects the second input 156, the first pass 20' is configured as a sigma-delta ADC. This allows an additional high resolution, narrowband mode, with the digital bits output from the coarse ADC 70 going to the signal processor 30. As stated above, one way to achieve high resolution is to oversample the ADC 10' when configured as a three-pass. A second method to achieve high resolution is to configure the "first" pass of the ADC 10' to be a stand alone sigma-delta converter. All the signal processing needed to decimate the oversampled digital data is contained in the signal processor 30. In this mode, the reconstruction circuit 72 is turned off, and the rest of the ADC is not used.

Another mode of operation can be implemented where the second input 156 of the MUX 152 is selected, so that the first pass 20' is configured as a sigma-delta, and the coarse DAC 74 is turned on and providing an oversampled reconstructed version of the input signal to the next stage 22 of the ADC 10'. In this mode, the ADC 10' is configured as a multi-pass ADC with the first stage 20' implemented as a sigma delta.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. An analog to digital converter (ADC) comprising:
    an input terminal for receiving an analog input signal;
    a plurality of processing stages, each processing stage adapted to generate an output signal from an input to that processing stage;
    first means for determining a mode of operation;
    second means for connecting said processing stages and said input terminal in a predetermined configuration in accordance with said mode of operation; and
    third means for automatically selecting a mode of operation based on said input signal, wherein said mode of operation is selected from a predetermined number of modes.

2. The invention of claim 1 wherein said ADC can be configured to use one, some, or all of said processing stages.

3. The invention of claim 1 wherein one or more of said processing stages includes means for choosing between said input signal and an output from a previous processing stage as an input to that processing stage.

4. The invention of claim 3 wherein said second means includes means for controlling said inputs to said processing stages in accordance with said mode of operation.

5. The invention of claim 1 wherein said second means further includes means for coupling said input terminal to a choice of two or more of said processing stages in accordance with said mode of operation.

6. The invention of claim 1 wherein said ADC further includes means for selecting and/or combining outputs from one or more of said processing stages in accordance with said mode of operation to generate a digital output representing said input signal.

7. The invention of claim 1 wherein said ADC further includes means for powering down circuit components that are not needed for said mode of operation.

8. The invention of claim 1 wherein said ADC further includes means for adjusting the power dissipated by said ADC in accordance with said mode of operation.

9. The invention of claim 1 wherein said ADC further includes means for adjusting the biases to the circuits in the ADC in accordance with said mode of operation.

10. The invention of claim 1 wherein said ADC further includes means for adjusting the sampling rate of said ADC in accordance with said mode of operation.

11. The invention of claim 1 wherein said third means includes means for determining the frequency components of said input signal.

12. The invention of claim 11 wherein said third means includes a Fast Fourier Transform (FFT).

13. The invention of claim 11 wherein said third means includes means for selecting a mode of operation based on said frequency components.

14. The invention of claim 1 wherein said first means includes means for receiving a signal representing a manually selected mode of operation from a user interface.

15. The invention of claim 1 wherein one or more of said processing stages can be configured as a sigma-delta ADC.

16. An analog to digital converter (ADC) comprising:
an input terminal for receiving an analog input signal;
a plurality of processing stages, each processing stage adapted to generate an output signal from an input to that processing stage;
first means for determining a mode of operation; and
second means for connecting said processing stages and said input terminal in a predetermined configuration in accordance with said mode of operation,
wherein said first means includes means for choosing between an automatically selected mode of operation and a manually selected mode of operation.

17. An analog to digital converter (ADC) comprising:
an input terminal for receiving an analog input signal;
a plurality of processing stages, each processing stage adapted to generate an output signal from an input to that processing stage;
first means for determining a mode of operation; and
second means for connecting said processing stages and said input terminal in a predetermined configuration in accordance with said mode of operation,
wherein said ADC can be configured as a subranging ADC with configurable number of bits per stage.

18. The invention of claim 17 wherein each processing stage includes means for generating a digital word representing a signal input to that stage.

19. The invention of claim 18 wherein some of said processing stages further include means for subtracting an analog reconstruction of said digital word from said input to produce a residue signal.

20. The invention of claim 19 wherein said processing stages are connected in series, with a residue signal output from one processing stage being input to the next processing stage.

21. The invention of claim 19 wherein one or more of said processing stages includes means for choosing between said input signal or a residue output from a previous processing stage as an input to that processing stage.

22. An analog to digital converter (ADC) comprising:
an input terminal for receiving an analog input signal;
a first processing stage adapted to generate a first output signal from said input signal;
a second processing stage including a multiplexer for choosing between said input signal or an output signal of said first processing stage as an input to said second processing stage, and adapted to generate a second output signal from said input chosen by said multiplexer;
a mechanism for determining a mode of operation and in accordance therewith generate control signals for said multiplexer, said mechanism including a signal processor for automatically selecting said mode of operation based on said input signal; and
error correction logic for selecting and/or combining output signals from said processing stages to generate a final digital output representing said input signal in accordance with said mode of operation.

23. The invention of claim 22 wherein said ADC further includes one or more intermediate processing stages coupled between said first and second processing stages, each intermediate processing stage adapted to generate an output signal from an input to said intermediate processing stage.

24. The invention of claim 23 wherein one or more of said intermediate processing stages further includes a multiplexer for choosing between said input signal or an output signal from a previous processing stage as an input to said intermediate processing stage.

25. The invention of claim 24 wherein said mechanism is adapted to generate control signals for said multiplexers in accordance with said mode of operation.

26. The invention of claim 24 wherein said ADC further includes a demultiplexer for coupling said input terminal to said first processing stage and said multiplexers.

27. The invention of claim 26 wherein said mechanism is adapted to generate control signals for said demultiplexer in accordance with said mode of operation.

28. The invention of claim 23 wherein said ADC can be configured to use one, some, or all of said processing stages.

29. The invention of claim 22 wherein said ADC further includes a module adapted to power down circuit components that are not needed for said mode of operation.

30. The invention of claim 22 wherein said ADC further includes a circuit bias controller adapted to adjust the power dissipated by said ADC in accordance with said mode of operation.

31. The invention of claim 22 wherein said ADC further includes a sampling rate controller for adjusting the sampling rate of said ADC in accordance with said mode of operation.

32. The invention of claim 22 wherein said ADC further includes a decimating filter for using oversampling techniques to increase dynamic range.

33. The invention of claim 22 wherein one or more of said processing stages can be configured as a sigma-delta ADC.

34. An analog to digital converter (ADC) comprising:
an input terminal for receiving an analog input signal;
a first processing stage adapted to generate a first output signal from said input signal;
a second processing stage including a multiplexer for choosing between said input signal or an output signal of said first processing stage as an input to said second processing stage, and adapted to generate a second output signal from said input chosen by said multiplexer;
a mechanism for determining a mode of operation and in accordance therewith generate control signals for said multiplexer; and
error correction logic for selecting and/or combining output signals from said processing stages to generate a final digital output representing said input signal in accordance with said mode of operation,
wherein said mechanism includes a multiplexer for choosing between an automatically selected mode of operation and a manually selected mode of operation.

35. The invention of claim 34 wherein said multiplexer is controlled by an external control signal.

36. An analog to digital converter (ADC) comprising:
an input terminal for receiving an analog input signal;
a first processing stage adapted to generate a first output signal from said input signal;
a second processing stage including a multiplexer for choosing between said input signal or an output signal of said first processing stage as an input to said second processing stage, and adapted to generate a second output signal from said input chosen by said multiplexer;

a signal processor for automatically determining a mode of operation based on said input signal and in accordance therewith generate control signals for said multiplexer; and error correction logic for selecting and/or combining output signals from said processing stages to generate a final digital output representing said input signal in accordance with said mode of operation.

37. The invention of claim 36 wherein said ADC further includes one or more intermediate processing stages coupled between said first and second processing stages, each intermediate processing stage adapted to generate an output signal from an input to said intermediate processing stage.

38. The invention of claim 37 wherein one or more of said intermediate processing stages further includes a multiplexer for choosing between said input signal or an output signal from a previous processing stage as an input to said intermediate processing stage.

39. The invention of claim 38 wherein said signal processor is adapted to generate control signals for said multiplexers in accordance with said mode of operation.

40. The invention of claim 38 wherein said ADC further includes a demultiplexer for coupling said input terminal to said first processing stage and said multiplexers.

41. The invention of claim 40 wherein said signal processor is adapted to generate control signals for said demultiplexer in accordance with said mode of operation.

42. The invention of claim 37 wherein said ADC can be configured to use one, some, or all of said processing stages.

43. The invention of claim 36 wherein said signal processor further includes a module adapted to power down circuit components that are not needed for said mode of operation.

44. The invention of claim 36 wherein said signal processor further includes a circuit bias controller adapted to adjust the power dissipated by said ADC in accordance with said mode of operation.

45. The invention of claim 36 wherein said signal processor further includes a sampling rate controller for adjusting the sampling rate of said ADC in accordance with said mode of operation.

46. The invention of claim 36 wherein said mode of operation is selected from a predetermined number of modes.

47. The invention of claim 46 wherein said signal processor includes a look-up table storing a plurality of control signals for each mode of operation.

48. The invention of claim 36 wherein said signal processor includes a Fourier transform processor for applying a Fourier transform on said input signal.

49. The invention of claim 48 wherein said signal processor further includes logic for selecting a mode of operation based on the output of said Fourier transform.

50. The invention of claim 36 wherein said signal processor is adapted to receive a signal representing a manually selected mode of operation from a user interface.

51. The invention of claim 50 wherein said signal processor includes a multiplexer for choosing between the automatically selected mode of operation and the manually selected mode of operation.

52. The invention of claim 51 wherein said multiplexer is controlled by an external control signal.

53. The invention of claim 36 wherein said signal processor further includes a decimating filter for using oversampling techniques to increase dynamic range.

54. An analog to digital converter (ADC) comprising:
an input terminal for receiving an analog input signal;
a first processing stage including a first quantizer for generating a first digital word from said input signal and a summing node circuit for subtracting an analog reconstruction of said first digital word from said input signal to produce a residue signal;
a second processing stage including a multiplexer for choosing between said input signal or a residue signal as an input to said second processing stage and a second quantizer for generating a second digital word from said input chosen by said multiplexer;
a digital signal processor (DSP) for automatically determining a mode of operation based on said input signal and in accordance therewith generate control signals for said multiplexer, said DSP including means for applying Fast Fourier Transform (FFT) on said digital output and means, and means for selecting a mode of operation based on the output of said FFT; and
error correction logic for selecting and/or combining said digital words to generate a digital output in accordance with said mode of operation.

55. The invention of claim 54 wherein said ADC further includes one or more intermediate processing stages coupled between said first and second processing stages, each intermediate processing stage including a quantizer for generating a digital word from an input to said intermediate processing stage and a summing node circuit for subtracting an analog reconstruction of said digital word from said input to produce a residue signal.

56. The invention of claim 55 wherein one or more of said intermediate processing stages further includes a multiplexer for choosing between said input signal or a residue signal from a previous processing stage as an input to said intermediate processing stage.

57. The invention of claim 56 wherein said DSP is adapted to generate control signals for said multiplexers in accordance with said mode of operation.

58. The invention of claim 56 wherein said ADC further includes a demultiplexer for coupling said input terminal to said first processing stage and said multiplexers.

59. The invention of claim 58 wherein said DSP is adapted to generate control signals for said demultiplexer in accordance with said mode of operation.

60. The invention of claim 55 wherein said ADC can be configured to use one, some, or all of said processing stages.

61. The invention of claim 56 wherein said ADC further includes a first sample and hold circuit coupled between said input terminal and said multiplexers.

62. The invention of claim 61 wherein said first sample and hold circuit is adapted for wideband signals.

63. The invention of claim 56 wherein said ADC further includes a second sample and hold circuit coupled between said input terminal and said first processing stage.

64. The invention of claim 54 wherein said DSP further includes a module adapted to power down circuit components that are not needed for said mode of operation.

65. The invention of claim 54 wherein said DSP further includes a circuit bias controller adapted to adjust the power dissipated by said ADC in accordance with said mode of operation.

66. The invention of claim 65 wherein said circuit bias controller includes a programmable digital to analog converter adapted to generate bias currents for the circuits in said ADC in accordance with said mode of operation.

67. The invention of claim 54 wherein said DSP further includes a sampling rate controller for adjusting the sampling rate of said ADC in accordance with said mode of operation.

68. The invention of claim 67 wherein said ADC includes a clock generator for generating a clock signal.

69. The invention of claim 68 wherein said sampling rate controller includes a programmable digital to analog converter adapted to generate bias currents for said clock generator.

70. The invention of claim 68 wherein said DSP includes a look-up table storing a plurality of control signals for each mode of operation.

71. The invention of claim 54 wherein said mode of operation is selected from a predetermined number of modes.

72. The invention of claim 54 wherein said DSP further includes a decimating filter for using oversampling techniques to increase dynamic range.

73. The invention of claim 54 wherein said first processing stage further includes a sigma-delta stage for generating a sigma-delta signal.

74. The invention of claim 73 wherein said first processing stage further includes a multiplexer adapted to select said sigma-delta signal or said input signal, and apply it to the input of said first quantizer.

75. The invention of claim 73 wherein said sigma-delta stage includes a feedback DAC for generating an error signal from the output of said quantizer.

76. The invention of claim 75 wherein said sigma-delta stage further includes a summing node circuit for subtracting said error signal from said input signal.

77. The invention of claim 76 wherein said sigma-delta stage further includes a filter bank for filtering the output of said summing node circuit to generate said sigma-delta signal.

78. An analog to digital converter (ADO) comprising:
an input terminal for receiving an analog input signal;
a first processing stage including a first quantizer for generating a first digital word from said input signal and a summing node circuit for subtracting an analog reconstruction of said first digital word from said input signal to produce a residue signal;
a second processing stage including a multiplexer for choosing between said input signal or a residue signal as an input to said second processing stage and a second quantizer for generating a second digital word from said input chosen by said multiplexer;
a digital signal processor (DSP) for automatically determining a mode of operation based on said input signal and in accordance therewith generate control signals for said multiplexer; and
error correction logic for selecting and/or combining said digital words to generate a digital output in accordance with said mode of operation,
wherein said DSP is adapted to receive a signal representing a manually selected mode of operation from a user interface.

79. The invention of claim 78 wherein said DSP includes a multiplexer for choosing between the automatically selected mode of operation and the manually selected mode of operation.

80. The invention of claim 79 wherein said multiplexer is controlled by an external control signal.

81. A method for digitizing an analog input signal including the steps of:
receiving said analog input signal at an input terminal;
providing a plurality of processing stages, each processing stage adapted to generate an output signal from an input to that processing stage;
determining a mode of operation; and
connecting said processing stages and said input terminal in a predetermined configuration in accordance with said mode of operation,
wherein said method further includes determining the frequency components of said input signal.

82. The invention of claim 71 wherein said method further includes powering down circuit components that are not needed for said mode of operation.

83. The invention of claim 81 wherein said method further includes adjusting the power dissipated in the circuit in accordance with said mode of operation.

84. The invention of claim 81 wherein said method further includes adjusting the circuit biases to the circuit components in accordance with said mode of operation.

85. The invention of claim 81 wherein said method further includes adjusting the sampling rate in accordance with said mode of operation.

86. The invention of claim 81 wherein said method includes determining said mode of operation based on said frequency components.

* * * * *